(12) United States Patent
Lenka et al.

(10) Patent No.: US 12,184,286 B1
(45) Date of Patent: Dec. 31, 2024

(54) CLOCK DUTY CYCLE MEASUREMENT

(71) Applicant: Cadence Design Systems, Inc., San Jose, CA (US)

(72) Inventors: Prakash Kumar Lenka, Orissa (IN); Hari Anand Ravi, Karnataka (IN); Jitendra Kumar Yadav, Bengaluru (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/831,685

(22) Filed: Jun. 3, 2022

(51) Int. Cl.
*H03K 5/00* (2006.01)
*G01R 29/02* (2006.01)
*H03K 3/017* (2006.01)
*H03K 5/24* (2006.01)

(52) U.S. Cl.
CPC .......... *H03K 3/017* (2013.01); *G01R 29/023* (2013.01); *H03K 5/2427* (2013.01); *H03K 5/2454* (2013.01); *H03K 5/249* (2013.01)

(58) Field of Classification Search
CPC ...... H03K 5/1565; H03K 3/017; H03K 5/153; H03K 5/249; H03K 5/2427; G01R 29/023
See application file for complete search history.

(56) References Cited

U.S. PATENT DOCUMENTS

| | | | | |
|---|---|---|---|---|
| 5,869,987 | A * | 2/1999 | Tang | H03K 5/2481 327/307 |
| 7,518,440 | B1 * | 4/2009 | Trifonov | H03F 3/45475 327/124 |
| 10,784,847 | B1 * | 9/2020 | Tandon | H03K 5/1565 |
| 11,256,286 | B1 * | 2/2022 | Meikanda Muthu Ayyanar | G06F 1/04 |
| 11,569,807 | B2 * | 1/2023 | Shimada | H03K 5/24 |
| 2006/0210166 | A1 * | 9/2006 | Takemoto | G06V 20/40 382/190 |
| 2016/0006393 | A1 * | 1/2016 | Kim | H03K 3/03 331/108 R |
| 2021/0203473 | A1 * | 7/2021 | Basil | H03L 7/0807 |

* cited by examiner

*Primary Examiner* — Tuan T Lam
(74) *Attorney, Agent, or Firm* — Mark H. Whittenberger; Holland & Knight LLP

(57) ABSTRACT

The present disclosure describes a circuit that may include a first amplifier portion configured to receive a first input signal corresponding to a first clock signal and a second input signal corresponding to a second clock signal. The circuit may include a first amplifier of the first amplifier portion. The first amplifier may be configured to receive a first amplifier input signal and a second amplifier input signal. The circuit may include a second amplifier portion configured to receive a first output signal from the first amplifier portion. In a first mode, the first amplifier input signal may be based upon the second input signal and the second amplifier input signal may be based upon the first input signal. In a second mode, the first amplifier input signal may be based upon the first input signal and the second amplifier input signal may be based upon the second input signal.

20 Claims, 14 Drawing Sheets

CLOCK DUTY CYCLE MEASUREMENT

FIELD OF THE INVENTION

Embodiments of the present disclosure relate to duty cycle measurements and, more particularly, to measuring duty cycles of clock signals.

BACKGROUND

Memory interface systems such as high-speed double data rate (DDR) memory interface systems may use both rising and falling edges of a clock signal for sampling data. Acceptable timing performance may be achieved if a corresponding clock's duty cycle is close to 50%. However, as the clock signal propagates through various semiconductor stages (e.g., delay line, clock tree, etc.), the clock duty cycle may get distorted. At high data rates, clock duty cycle distortion may result in timing loss and may lead to bit failure.

SUMMARY

Accordingly, a circuit for duty cycle measurement may include a first amplifier portion configured to receive a first input signal corresponding to a first clock signal and a second input signal corresponding to a second clock signal. The circuit may further include a first amplifier of the first amplifier portion. The first amplifier may be configured to receive a first amplifier input signal and a second amplifier input signal. The circuit may also include a second amplifier portion configured to receive a first output signal from the first amplifier portion. In a first mode of the circuit, the first amplifier input signal may be based upon, at least in part, the second input signal and the second amplifier input signal may be based upon, at least in part, the first input signal. In a second mode of the circuit, the first amplifier input signal may be based upon, at least in part, the first input signal and the second amplifier input signal may be based upon, at least in part, the second input signal.

One or more of the following features may be included. In some embodiments, the first input signal may correspond to a first average voltage value associated with the first clock signal and the first clock signal may be a true clock signal. The second input signal may correspond to a second average voltage value associated with the second clock signal and the second clock signal may be a complementary clock signal. A low pass filter may be in communication with the first amplifier portion. The low pass filter may be configured to receive the first clock signal and the second clock signal and output the first input signal and the second input signal. The first amplifier may be in communication with a high impedance current source configured to attenuate supply noise associated with the first output signal. The second amplifier portion may be in communication with a bias current source configured to attenuate supply noise associated with a second output signal. The first amplifier may use a unity feedback configuration that may be configured to reduce offset voltage associated with the first amplifier. At least one of the first amplifier portion and the second amplifier portion may be in communication with a controlled current source configured to reduce power consumption of the circuit. The first amplifier may be a p-type differential amplifier. The second amplifier portion may include an n-type common source amplifier. The second amplifier portion may be in communication with a p-channel metal-oxide-semiconductor (PMOS) current source. A differential amplifier structure of the first amplifier may reduce a duty cycle detection error due to charge injection.

In another embodiment of the present disclosure, a method for duty cycle measurement may include receiving, by a first amplifier portion, a first input signal corresponding to a first clock signal and a second input signal corresponding to a second clock signal. The method may further include receiving, by a first amplifier of the first amplifier portion, a first amplifier input signal and a second amplifier input signal. The method may also include receiving, by a second amplifier portion, a first output signal from the first amplifier portion. In a first mode associated with the first amplifier portion, the first amplifier input signal may be based upon, at least in part, the second input signal and the second amplifier input signal may be based upon, at least in part, the first input signal. In a second mode associated with the first amplifier portion, the first amplifier input signal may be based upon, at least in part, the first input signal and the second amplifier input signal may be based upon, at least in part, the second input signal.

One or more of the following features may be included. In some embodiments, the first input signal may correspond to a first average voltage value associated with the first clock signal and the first clock signal may be a true clock signal. The second input signal may correspond to a second average voltage value associated with the second clock signal and the second clock signal may be a complementary clock signal. The method may include receiving, by a low pass filter in communication with the first amplifier portion, the first clock signal and the second clock signal. The method may further include outputting, by the low pass filter in communication with the first amplifier portion, the first input signal and the second input signal. The method may also include attenuating, by a high impedance current source in communication with the first amplifier, first supply noise associated with the first output signal. The method may additionally include attenuating, by a bias current source in communication with the second amplifier portion, second supply noise associated with a second output signal. Moreover, the method may include reducing, by a unity feedback configuration of the first amplifier, offset voltage associated with the first amplifier. Furthermore, the method may include reducing, by a controlled current source in communication with one of the first amplifier portion and the second amplifier portion, power consumption of a circuit comprising the first amplifier portion and the second amplifier portion. Also, the method may include reducing, by a differential amplifier structure of the first amplifier, charge injection associated with the first amplifier. The first amplifier may be a p-type differential amplifier. The second amplifier portion may include an n-type common source amplifier. The second amplifier portion may be in communication with a p-channel metal-oxide semiconductor (PMOS) current source.

In another embodiment of the present disclosure, a system for duty cycle measurement and correction may include a duty cycle measurement circuit. The duty cycle measurement circuit may include a first amplifier portion configured to receive a first input signal and a second input signal. The duty cycle measurement circuit may further include a first amplifier of the first amplifier portion. The first amplifier may be configured to receive a first amplifier input signal and a second amplifier input signal. In a first mode of the duty cycle measurement circuit, the first amplifier input signal may be based upon, at least in part, the second input signal and the second amplifier input signal may be based upon, at least in part, the first input signal. In a second mode of the duty cycle measurement circuit, the first amplifier input signal may be based upon, at least in part, the first input signal and the second amplifier input signal may be based upon, at least in part, the second input signal. The system for duty cycle measurement and correction may further include a duty cycle adjustment circuit. The duty cycle adjustment circuit may be in communication with the duty cycle measurement circuit. Further, the duty cycle adjustment circuit may be configured to adjust a duty cycle corresponding to a clock based upon, at least in part, a measurement signal output by the duty cycle measurement circuit.

One or more of the following features may be included. In some embodiments, the first input signal may correspond to a first average voltage value associated with a true clock signal, and the second input signal may correspond to a second average voltage value associated with a complementary clock signal.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
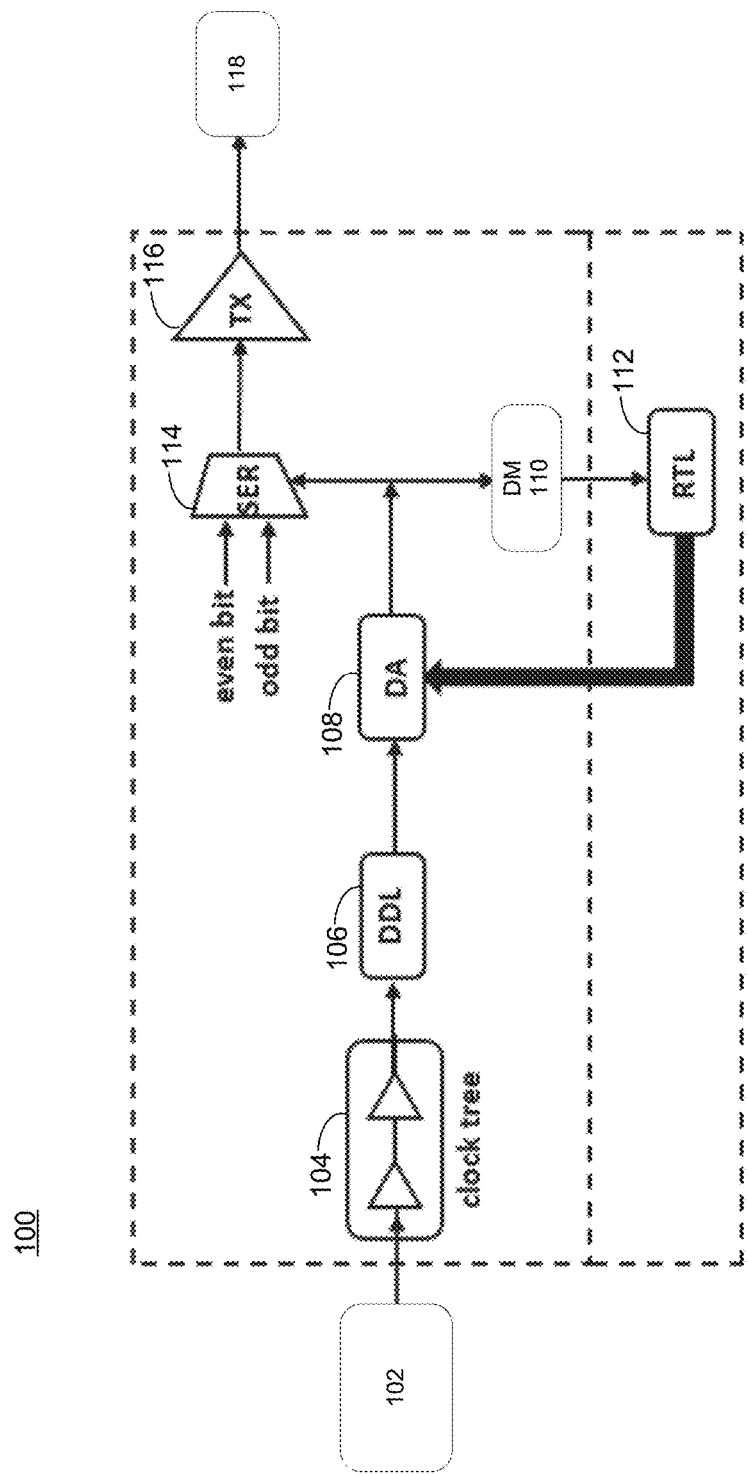
FIG. 1 is a diagram illustrating an example duty cycle correction loop.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings denote like elements.

A clock duty cycle may become distorted as a corresponding clock signal propagates through various semiconductor components, which may result in timing loss and bit failure at high data rates. Referring to FIG. 1, a duty cycle correction loop 100 may be employed to detect and correct a clock duty cycle. The duty cycle correction loop 100 may include a clock input 102, a clock tree 104, a digital delay line (DDL) 106, a duty cycle adjust (DA) block 108, a duty cycle measurement (DM) block 110, a register transfer level (RTL) block 112, a serializer (SER) 114, a transmitter 116, and an output 118.

The duty cycle measurement block 110 may be used to detect a clock duty cycle. Further, the duty cycle adjust block 108 may be used to correct the clock duty cycle. The RTL block 112 may be used to determine whether to adjust a duty cycle adjust block code based upon an output of the duty cycle measurement block 110. An output of '1' by the duty cycle measurement block 110 may indicate that the clock duty cycle is greater than 50%. Further, an output of '0' by the duty cycle measurement block 110 may indicate that the clock duty cycle is less than 50%. The duty cycle adjust block code may be adjusted by the RTL block 112 based upon the duty cycle measurement block 110 until the duty cycle is 50%. Thus, the duty cycle correction loop 100 may be limited (in its ability to correct the duty cycle) by the accuracy of the duty cycle measurement block 110.

The techniques and features of the present disclosure may improve the accuracy of duty cycle measurement (of, for example, a high-speed clock signal) which may be important at high data rates. For example, systems implementing low-power double data rate (LPDDR) protocol such as LPDDR5X may operate at speeds around 8533 Mbps, where it may be important to improve accuracy of the duty cycle measurement. The techniques and features of the present disclosure may be used to improve the accuracy of duty cycle measurement by increasing an effective input signal magnitude (e.g., by a factor of 2, with the benefit of comparator offset cancellation) using an auto-zeroing technique, improving power supply noise rejection capability of the duty cycle measurement block, reducing measurement error caused by charge injection, and decreasing power consumption.

Figure 2:
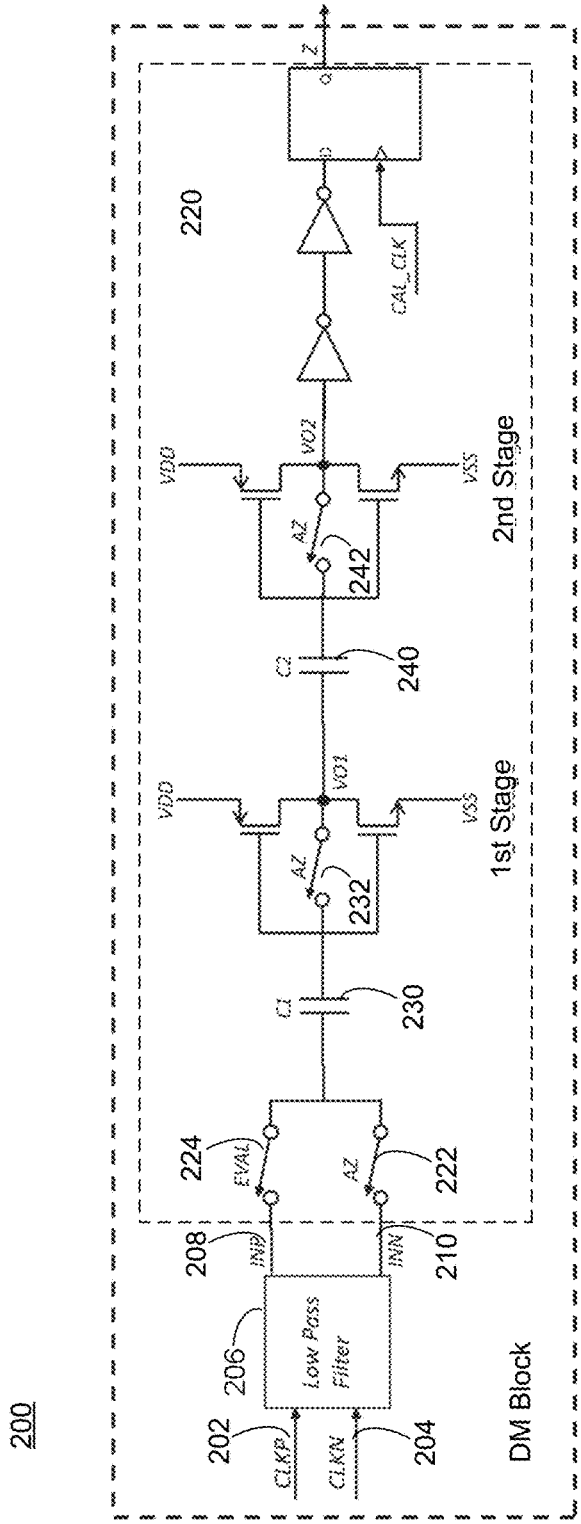
FIG. 2 is a diagram illustrating an example architecture for duty cycle measurement.

Referring to FIG. 2, a diagram illustrating an example architecture for duty cycle measurement is shown. The duty cycle measurement block 200 may include a comparator 220, which may include two portions and/or modes of operation. A low pass filter 206 may receive clock signals 202 and 204 from two complementary clocks CLKP and CLKN, respectively. CLKP may be a positive sample or phase clock and CLKN may be a negative sample or phase clock. To achieve acceptable timing performance, the duty cycle of the clocks CLKP and CLKN may be optimal at around 50%. Thus, the duty cycle of the clocks CLKP and CLKN may be evaluated to determine if the duty cycle of each clock is greater than or less than 50%.

The clock signals 202 and 204 (corresponding to the clocks CLKP and CLKN, respectively) may be passed through the low pass filter 206 to generate input signals 208 and 210 (i.e., INP and INN, respectively), which may have DC voltages corresponding to their respective duty cycles. For example, if the duty cycles of CLKP and CLKN are 51% and 49%, respectively, INP (e.g., input signal 208) may have a value of 0.51 VDD and INN (e.g., input signal 210) may have a value of 0.49 VDD. The difference between the INP and INN values may be evaluated using a two-stage low offset clocked comparator (e.g., comparator 220).

The comparator 220 may employ an auto-zeroing technique in which the comparator 220 operates in two modes (which may also be referred to phases). The first mode may be an auto-zeroing (AZ) mode and the second mode may be an evaluation (EVAL) mode. The comparator 220 may include a switch 222 (e.g., for the AZ mode) and a switch 224 (e.g., for the EVAL mode). In the AZ mode, the offset of the comparator 220 may be stored in coupling capacitors 230 and 240 (e.g., capacitors C1 and C2, respectively). In the EVAL mode, a comparator evaluation may be performed. To switch between the two modes (e.g., the AZ mode and the EVAL mode), a low frequency clock CAL_CLK, which may operate at about 10-25 MHz, may be used.

Figure 3:
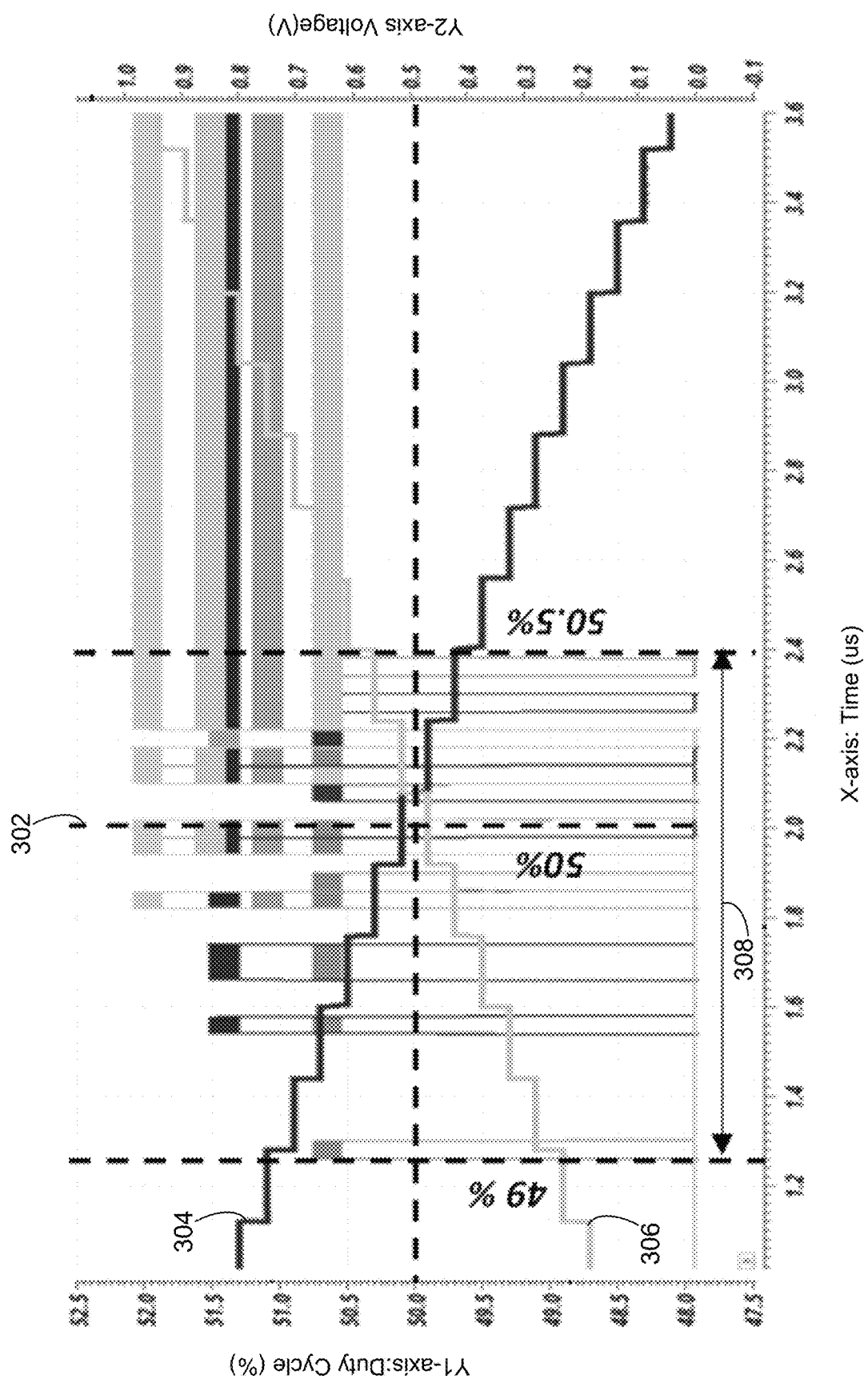
FIG. 3 is a graph illustrating example transfer characteristics associated with the architecture of FIG. 2.

Referring to FIG. 3, a graph 300 illustrating example transfer characteristics associated with the architecture of FIG. 2 is shown. The duty cycle measurement block 200 may be sensitive to power supply noise. The graph 300 may show transfer characteristics for the duty cycle measurement block 200 across all PVT (process, voltage, and temperature) in the presence of supply noise, where the X-axis indicates time, the Y1-axis indicates the duty cycle of INP and INN (%), and the Y2-axis indicates duty cycle measurement block output voltage (V). For example, the graph 300 shows an ideal duty cycle measurement block output switching point 302 (i.e., for a 50% duty cycle). Further, the graph 300 shows an INN signal duty cycle variation over time, as indicated by reference indicator 304. The graph 300 also shows an INP signal duty cycle variation over time, as indicated by reference indicator 306. Additionally, the graph 300 shows a duty cycle measurement block output dithering zone (as indicated by reference indicator 308), where the duty cycle measurement block output may fluctuate (e.g., between 49% and 50.5%) due to supply noise sensitivity and charge injection error.

The graph 300 may show one or more limitations associated with the architecture of the duty cycle measurement block 200, including sensitivity to power supply noise, high power consumption, and error due to charge injection. For example, supply noise of a first stage inverter may be amplified by a gain $(g_{mp}r_{Op})$ and also amplified by a second stage gain $(g_{mp}r_{Op}+g_{mn}r_{On})$. A signal magnitude at the input of the amplifier (e.g., INP–INN) may be less (e.g., about 15 mV for 51% duty cycle at INP and 49% duty cycle at INN), so noise amplification may be undesirable and may lead to a reduced signal to noise ratio (SNR). The reduction in SNR may lead to duty cycle detection error. This phenomenon may be seen in graph 300 where the duty cycle measurement block output may dither (i.e., be unstable) for a window of input clock duty cycle (e.g., 49% to 50.5%). In other words, the duty cycle measurement block output may have a logic value of 1 only if the input clock duty cycle is greater than 50.5% and may have a logic value of 0 only if the input clock duty cycle is less than 49%.

Further, the architecture of the duty cycle measurement block 200 may have high power consumption. In AZ mode (e.g., in the AZ phase), a self-biased inverter may be used in the architecture of the duty cycle measurement block 200 and may operate near 0.5 VDD (e.g., the switching point of the inverter), where DC power consumption of the inverter is near or at a maximum level. This may lead to an overall increase in power consumption of the duty cycle measurement block 200.

Additionally, charge injection may cause an error in the duty cycle measurement block 200. For example, switches 232 and 242 of the duty cycle measurement block 200 may be implemented using metal-oxide-semiconductor (MOS) switches. When the MOS switches are in an OFF position (i.e., in the EVAL mode), a residue charge may flow to a floating capacitor node. This may result in an evaluation error due to charge injection.

Figure 4A:
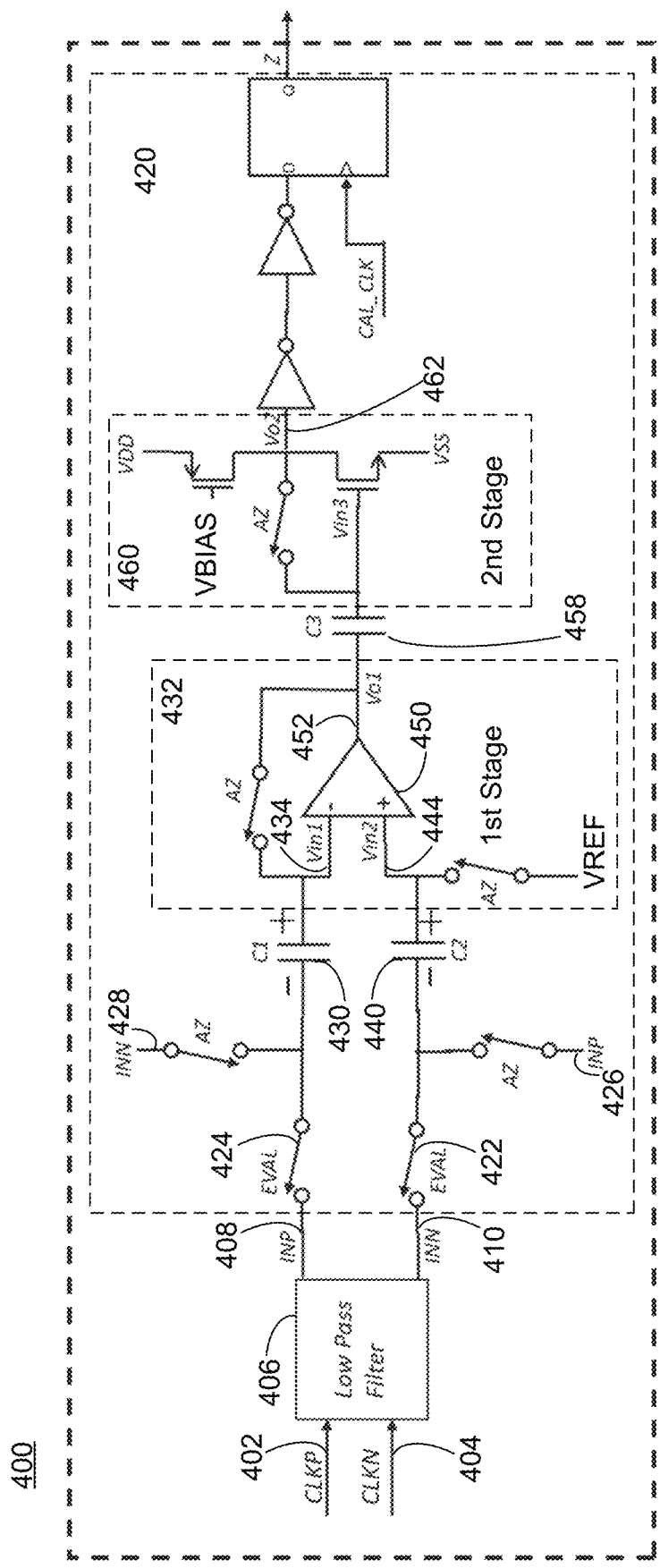
FIG. 4A is a diagram illustrating an example architecture for duty cycle measurement in accordance with the present disclosure.

Accordingly, a circuit that may provide improved duty cycle measurement is described by the present disclosure. Referring to FIG. 4A, a duty cycle measurement block 400 may include the circuit (which may be referred to as circuit 400) for improved duty cycle measurement. The duty cycle measurement block 400 may include a comparator 420, which may include two portions and/or modes. A filter (e.g., low pass filter 406) may be in communication with a first amplifier portion 432 (e.g., corresponding to a 1st stage) and may be configured to receive a first input signal (e.g., input signal 408) corresponding to a first clock signal (e.g., clock signal 402, which may be a true clock signal) and a second input signal (e.g., input signal 410) corresponding to a second clock signal (e.g., clock signal 404, which may be a complementary clock signal). The clock signals 402 and 404 may be from two complementary clocks CLKP and CLKN, respectively. CLKP may be a positive sample or phase clock and CLKN may be a negative sample or phase clock. To achieve acceptable timing performance, the duty cycle of the clocks CLKP and CLKN may be optimal at around 50%. Thus, the duty cycle of the clocks CLKP and CLKN may be evaluated to determine if the duty cycle of each clock is greater than or less than 50%.

The clock signals 402 and 404 (corresponding to the clocks CLKP and CLKN, respectively) may be passed through the low pass filter 406 to generate input signals 408 and 410 (i.e., INP and INN, respectively), which may have DC voltages corresponding to their respective duty cycles. For example, if the duty cycles of CLKP and CLKN are 51% and 49%, respectively, INP (e.g., input signal 408) may have a value of 0.51 VDD and INN (e.g., input signal 410) may have a value of 0.49 VDD. The difference between the INP and INN values may be evaluated using a two-stage low offset clocked comparator (e.g., comparator 420).

The comparator 420 may employ an auto-zeroing technique in which the comparator 420 operates in two modes (which may also be referred to as phases). The first mode may be an auto-zeroing (AZ) mode and the second mode may be an evaluation (EVAL) mode. The comparator 420 may include switches 422, 424, 426, and 428. In the AZ mode, the offset of the comparator 420 may be stored in coupling capacitors 430, 440, and 458 (e.g., capacitors C1, C2, and C3 respectively). In the EVAL mode, a comparator evaluation may be performed. To switch between the two modes (e.g., the AZ mode and the EVAL mode), a low frequency clock CAL_CLK, which may operate at about 10-25 MHz, may be used.

The duty cycle measurement block 400 may be a circuit that includes the first amplifier portion 432 (e.g., corresponding to the 1st stage) configured to receive the first input signal (e.g., input signal 408) corresponding to the first clock signal (e.g., clock signal 402, which may be the true clock signal) and the second input signal (e.g., input signal 410) corresponding to the second clock signal (e.g., clock signal 404, which may be the complementary clock signal). The circuit may further include a first amplifier 450 of the first amplifier portion 432. The first amplifier 450 may be configured to receive a first amplifier input signal (e.g., signal 434) and a second amplifier input signal (e.g., signal 444). The circuit may also include a second amplifier portion 460 (e.g., corresponding to the 2nd stage) configured to receive a first output signal (e.g., signal 452) from the first amplifier portion.

In a first mode (e.g., AZ mode) of the circuit 400, the first amplifier input signal (e.g., signal 434) may be based upon the second input signal (e.g., INN, also shown as signal 410 or 428) and the second amplifier input signal (e.g., signal 444) may be based upon the first input signal (e.g., INP, also shown as signal 408 or 426). In a second mode (e.g., EVAL mode) of the circuit 400, the first amplifier input signal (e.g., signal 434) may be based upon the first input signal (e.g., INP, also shown as signal 408 or 426) and the second amplifier input signal (e.g., signal 444) may be based upon the second input signal (e.g., INN, also shown as signal 410 or 428).

In some embodiments, the first input signal (e.g., INP, also shown as signal 408 or 426) may correspond to a first average voltage value associated with the first clock signal (e.g., clock signal 402). The first clock signal may be a true clock signal. Further, the second input signal (e.g., INN, also shown as signal 410 or 428) may correspond to a second average voltage value associated with the second clock signal (e.g., clock signal 404). The second clock signal may be a complementary clock signal.

Figure 4B:
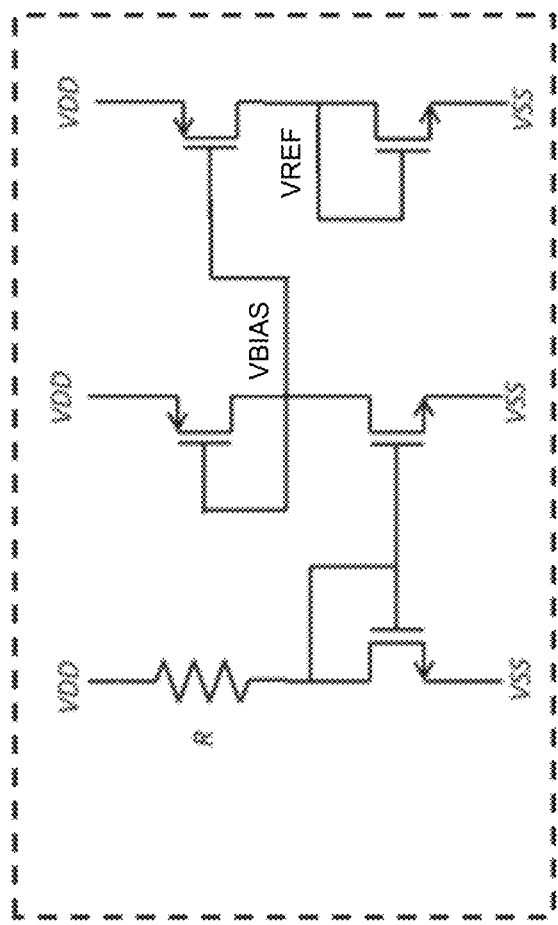
FIG. 4B is a diagram illustrating an example technique for auxiliary bias in accordance with the present disclosure.

Referring to FIG. 4B, an auxiliary bias block 480 is shown. The auxiliary bias block 480 may generate bias signals shown in FIG. 4A. For example, the signals VREF and VBIAS shown in FIG. 4A may be generated using the auxiliary bias block 480 of FIG. 4B. The signal VREF may be generated such that supply noise is attenuated (or significantly attenuated) as it biases a PMOS input of the 1st stage amplifier. Further, the signal VBIAS may be generated such that it tracks supply noise as it biases a gate of a PMOS current source for a 2nd Stage amplifier.

Figure 5A:
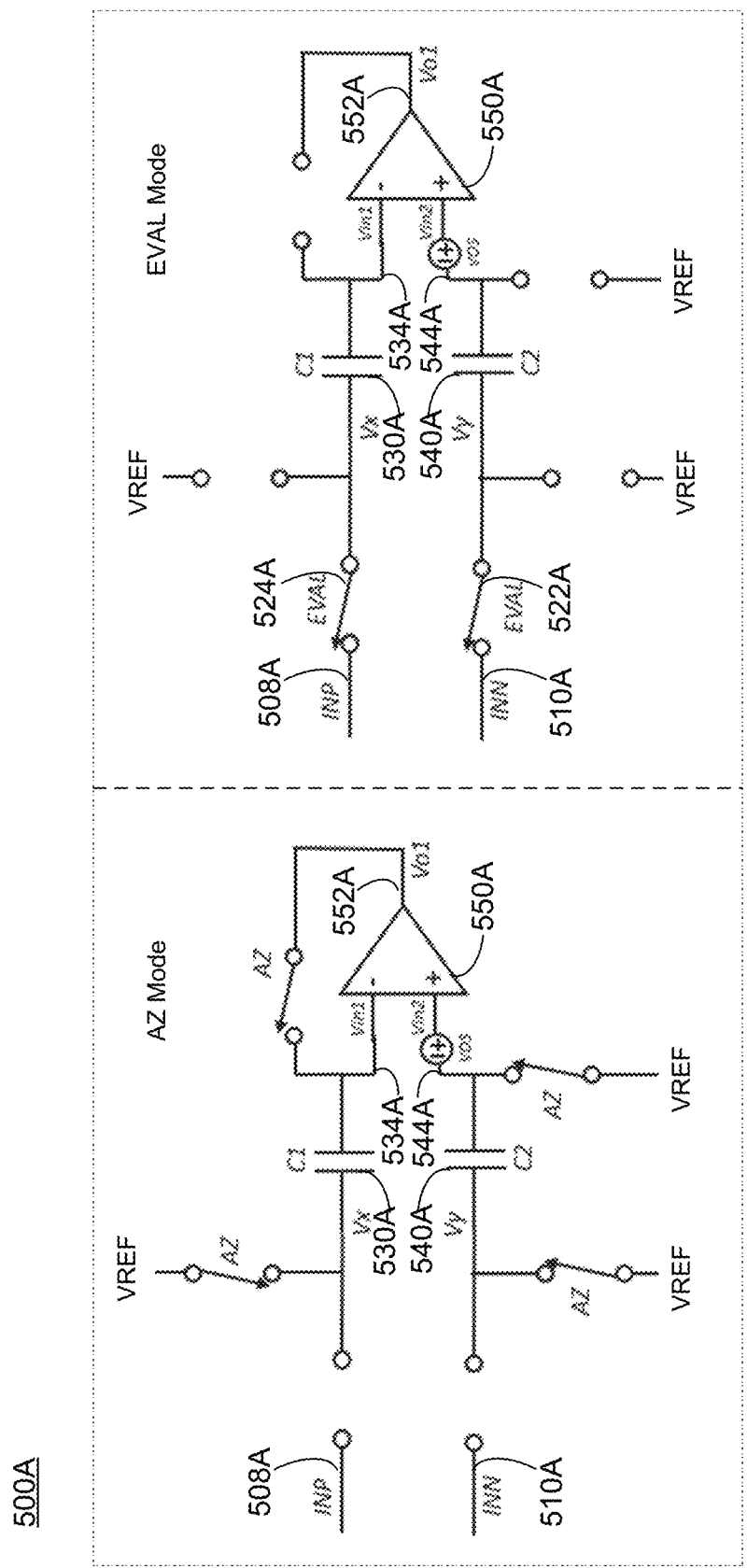
FIG. 5A is a diagram illustrating an example technique for auto-zeroing.

Referring to FIG. 5A, an auto-zeroing technique that may be implemented via an architecture 500A is shown, where $V_{OS}$ may be a DC offset of a first amplifier (e.g., amplifier 550A). In an auto-zeroing (AZ) mode (shown on the left side of FIG. 5A), Vin2=VREF+$V_{OS}$ and Vin1=VREF+$V_{OS}$, where it is assumed that an open loop DC gain of comparator, $A_{OL}$, is much greater than 1. In an evaluation (EVAL) mode (shown on the right side of FIG. 5A), Vin1=(VREF+$V_{OS}$)+(INP−VREF) and Vin2=(VREF+$V_{OS}$)+(INN−VREF). Thus, Vo1=$A_{OL}$(Vin2−Vin1)=−$A_{OL}$*[INP−INN].

Figure 5B:
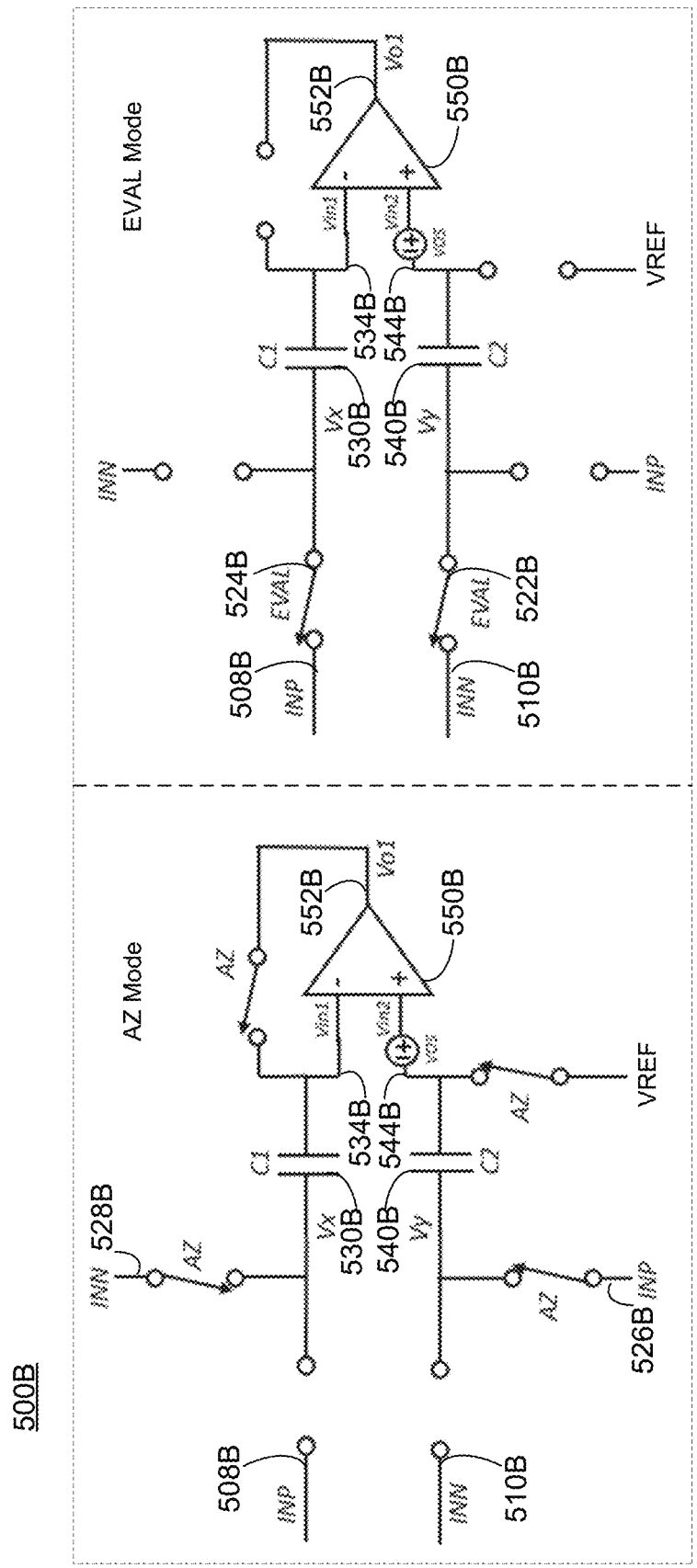
FIG. 5B is a diagram illustrating an example technique for auto-zeroing in accordance with the present disclosure.

Referring to FIG. 5B, an auto-zeroing technique that may be implemented via an architecture 500B is shown, where $V_{OS}$ may be a DC offset of a first amplifier (e.g., amplifier 450 of FIG. 4A or 550B of FIG. 5B). In one or more embodiments of the present disclosure, the architecture 500B may incorporated in circuit 400. The auto-zeroing technique of architecture 500B may improve a signal-to-noise ratio (SNR) and increase an effective input signal magnitude (as compared to the auto-zeroing technique of architecture 500A shown in FIG. 5A). In an AZ mode, the differential amplifier 550B may be in a closed loop configuration, and in an EVAL mode, the differential amplifier 550B may be in an open loop configuration. In the AZ mode (shown on the left side of FIG. 5B): Vin2=VREF+$V_{OS}$ and Vin1=VREF+$V_{OS}$, where it is assumed that an open loop DC gain of comparator, $A_{OL}$ is much greater than 1. In the EVAL mode (shown on the right side of FIG. 5B): Vin1=(VREF+$V_{OS}$)+(INP−INN) and Vin2=(VREF+VOS)+(INN−INP). Thus, Vo1=$A_{OL}$(Vin2−Vin1)=−$A_{OL}$*2[INP−INN]. As a result, an effective input signal magnitude (e.g., corresponding to Vo1) may be increased by a factor of two using the auto-zeroing technique of FIG. 5B and architecture 500B (e.g., where Vo1=−$A_{OL}$*2[INP−INN]), as compared to the auto-zeroing technique of FIG. 5A and architecture 500A (e.g., where Vo1=−$A_{OL}$*[INP−INN]).

Thus, by providing INN and INP via input AZ switches as shown in FIG. 5B (e.g., rather than providing VREF as a bias voltage via input AZ switches as shown in FIG. 5A), twice the signal input may be ensured for the 1st stage (e.g., first amplifier portion 432). In other words, the configuration shown in FIG. 5B may ensure a 2X signal input for the 1st stage for the EVAL mode such that the SNR at the input of the 1st stage amplifier (e.g., amplifier 450 of FIG. 4A or 550B of FIG. 5B) may be quadrupled, which may mitigate effects of error due to circuit non-idealities, such as offset, unwanted noise, etc. In this way, using the techniques and features described by the present disclosure, an input combination may be intelligently selected to ensure around a 2X input difference at a differential amplifier (e.g., first amplifier 450, differential amplifier 550B) of the comparator (e.g., the comparator 420). Due to a higher SNR, the effect of relatively smaller noise components (e.g., noise such as device noise, charge injection noise, etc.) may be suppressed.

Figure 6:
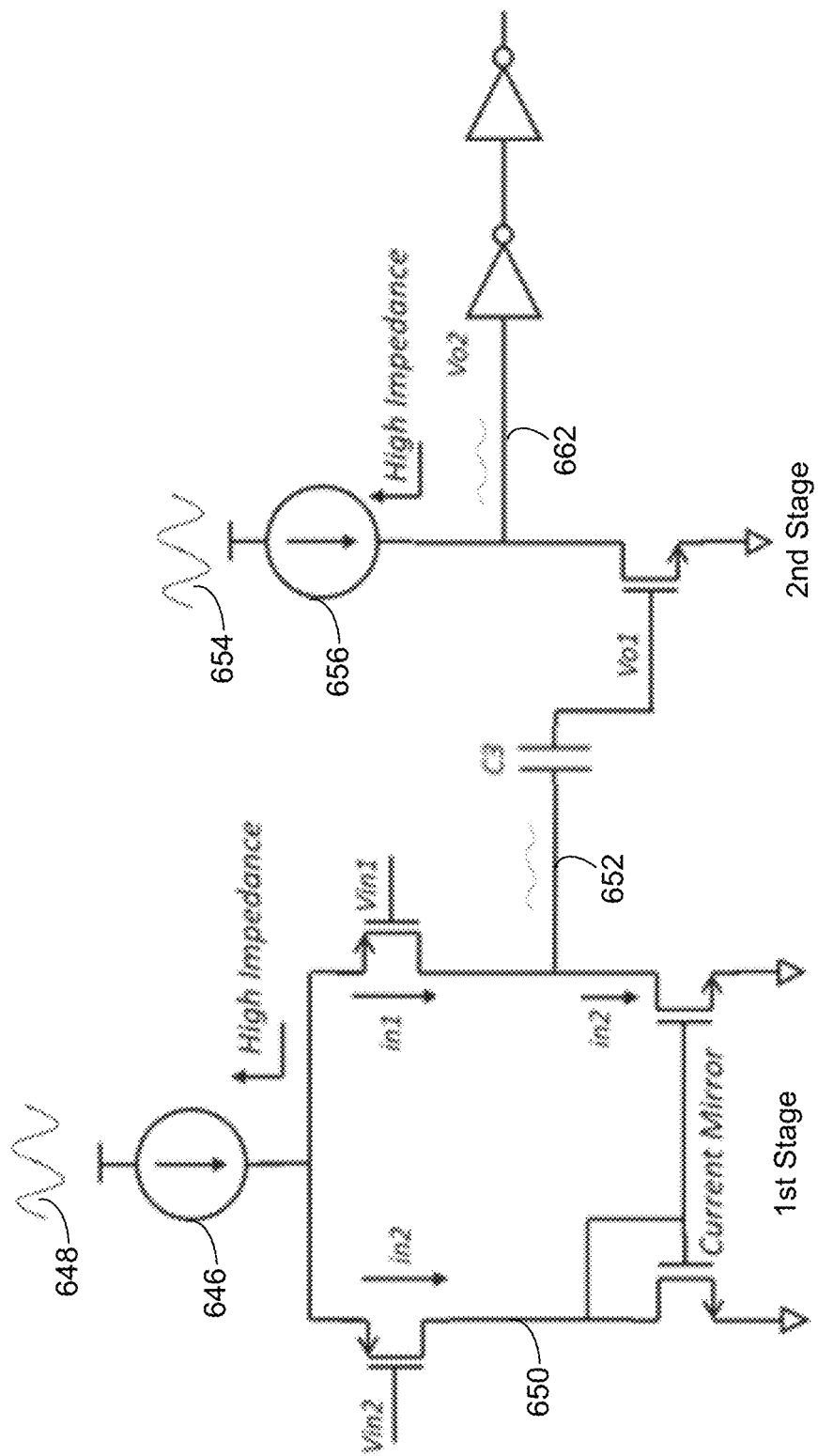
FIG. 6 is a diagram illustrating an example amplifier topology in accordance with the present disclosure.

Referring to FIG. 6, a diagram illustrating an example amplifier topology in accordance with the present disclosure is shown. In one or more embodiments, the amplifier topology of FIG. 6 may be incorporated in circuit 400. Further, in one or more embodiments, the first amplifier (e.g., differential amplifier 650) may be in communication with a high impedance current source (e.g., current source 646) configured to attenuate first supply noise (e.g., supply noise 648) associated with a first output signal (e.g., signal 652). In other words, the first amplifier may use a high impedance current source (e.g., current source 646) to attenuate or significantly attenuate the effect of supply noise (e.g., supply noise 648) at its output Vo1. The first amplifier (e.g., differential amplifier 650) may be a p-type differential amplifier. At output Vo1, in1 may equal in2, due to symmetricity, thus cancelling the effective noise current.

The output Vo2 of the second amplifier portion (e.g., second amplifier portion 460) may have two sources of noise including noise from the output Vo1 and second supply noise (e.g., supply noise 654). As discussed above, the noise from the output Vo1 may be reduced due to the high impedance current source (e.g., current source 646) to the first amplifier (e.g., differential amplifier 650) and due to symmetric structure. Further, the second amplifier portion may be in communication with a bias current source (e.g., current source 656) configured to attenuate the second supply noise (e.g., supply noise 654) associated with a second output signal (e.g., signal 662). The bias current source may attenuate or significantly attenuate the second supply noise (e.g., supply noise 654) due to its high impedance. For example, the second amplifier portion may include an n-type common source amplifier, and may be in communication with a p-channel metal-oxide-semiconductor (PMOS) current source which may be the bias current source (e.g., current source 656). Noise from the output Vo1 may be amplified (e.g., by the common source amplifier) in the second amplifier portion but this noise should already be significantly attenuated, as discussed above.

In this way, the amplifier topology of FIG. 6 may be implemented to improve power supply rejection. Thus, at least one (or both) of the first amplifier portion and the second amplifier portion may be in communication with a controlled current source (e.g., current source 646 and/or current source 656) configured to reduce power consumption of the circuit. In other words, both amplifier stages may be current controlled as current controlled amplifiers (e.g., the first amplifier (or p-type differential amplifier) and the second amplifier (or n-type common source amplifier)) may be used in both stages to reduce power consumption.

Figure 7:
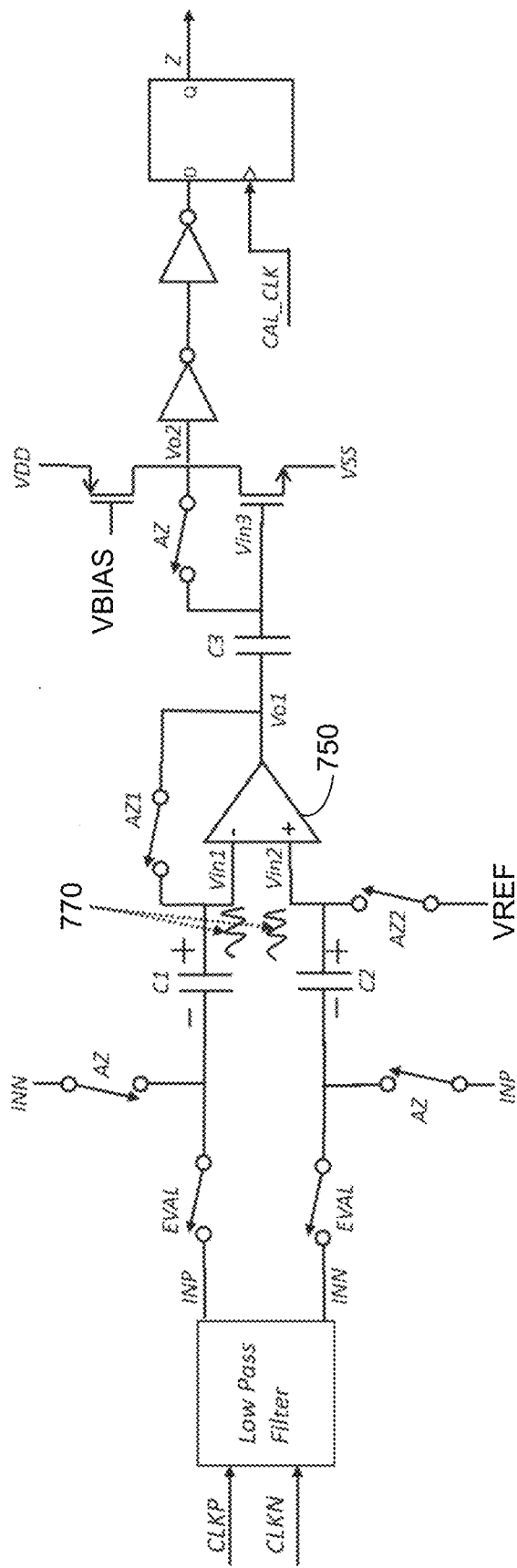
FIG. 7 is a diagram illustrating an example technique for reducing charge injection in accordance with the present disclosure.

Referring to FIG. 7, a diagram illustrating an example technique for reducing charge injection in accordance with embodiments of the present disclosure is shown. Noise 770 may be caused by charge injection due to toggling switches AZ1 and AZ2. In an AZ mode or phase, Vin1=Vin2=Vo1=VREF. While opening an AZ switch, an amount of charge injected may be dependent on the equation $Cox*W*L*(V_{GS}-V_{TH})$, where Cox may be a gate oxide capacitance of a MOS, W may be a width of the MOS, L may be a length of the MOS, Vas may be a gate to source voltage of the MOS, and $V_{TH}$ may be a threshold voltage of the MOS. In one or more embodiments, the first amplifier (e.g., the differential amplifier 750) may use a unity feedback configuration (e.g., while in AZ mode), and thus Vin1=Vin2. The unity feedback configuration may be configured to reduce charge injection associated with the first amplifier. For example, as $V_{OS}$ may be the same for both switches AZ1 and AZ2 due to the unity feedback configuration of the differential amplifier 750, the same amount of charge may be injected at input terminals corresponding to both Vin1 and Vin2, the offset voltage may be stored in capacitor C1 while in AZ mode, and the stored offset may be cancelled while in EVAL mode. Thus, noise may be reduced as a result of the property of common mode rejection associated with the differential amplifier 750.

Figure 8:
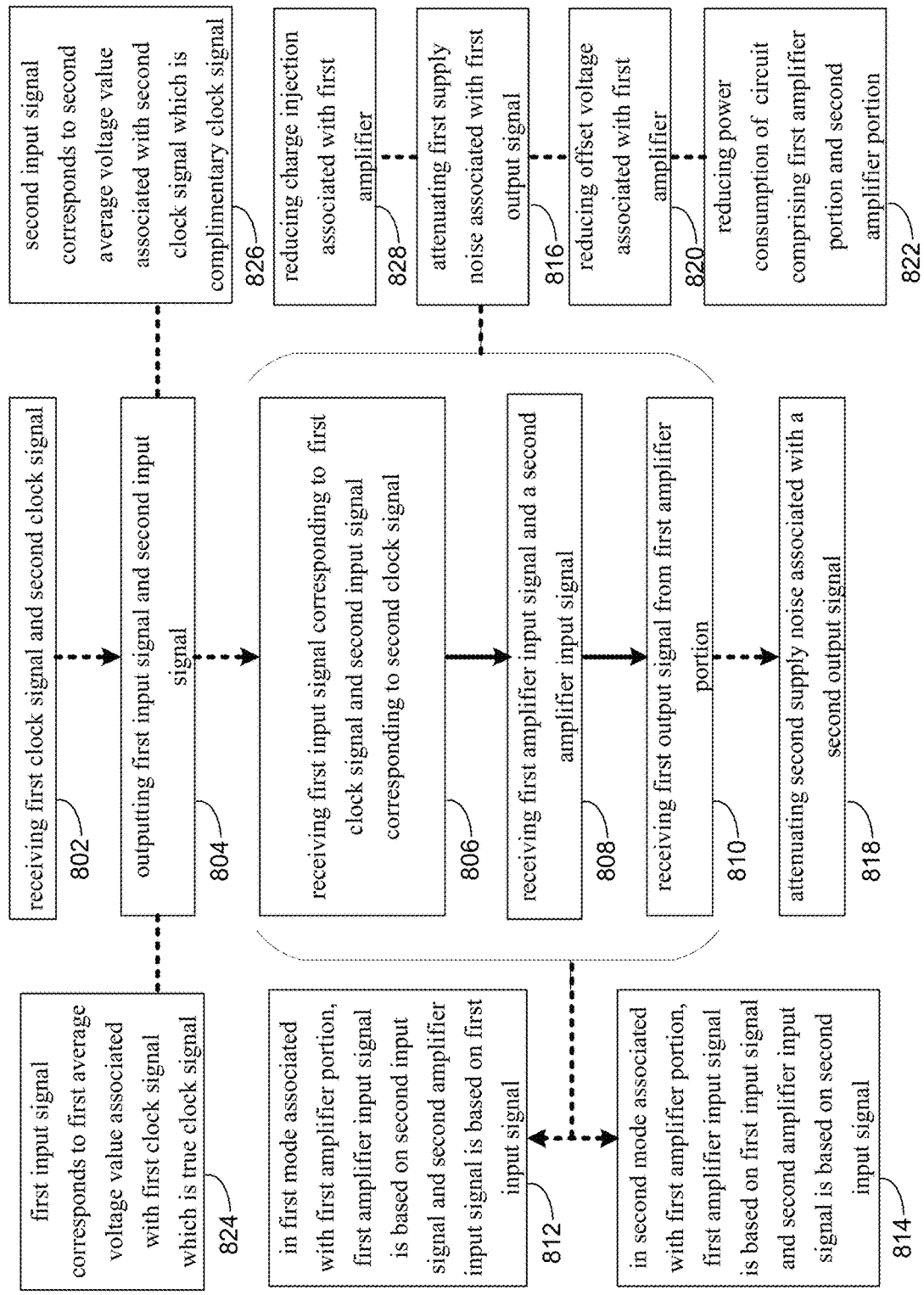
FIG. 8 is a flowchart illustrating example operations for duty cycle measurement in accordance with the present disclosure.

Referring to FIG. 8, a flowchart illustrating example operations (e.g., method 800) for duty cycle measurement in accordance with another embodiment of the present disclosure is shown. The method 800 may include receiving (806), by a first amplifier portion (e.g., amplifier portion 432 of FIG. 4A), a first input signal (e.g., input signal 408 or 508B) corresponding to a first clock signal (e.g., clock signal 402) and a second input signal (e.g., input signal 410 or 510B) corresponding to a second clock signal (e.g., clock signal 404). The method 800 may further include receiving (808), by a first amplifier (e.g., amplifier 450 or 550B) of the first amplifier portion (e.g., amplifier portion 432 of FIG. 4A), a first amplifier input signal (e.g., signal 434 or 534B) and a second amplifier input signal (e.g., signal 444 or 544B). The method 800 may also include receiving (810), by a second amplifier portion (e.g., amplifier portion 460 of FIG. 4A), a first output signal (e.g., signal 452 or 552B) from the first amplifier portion (e.g., amplifier portion 432 of FIG. 4A). In a first mode (812) (e.g., AZ mode as shown on the left side of FIG. 5B) associated with the first amplifier portion (e.g., amplifier portion 432 of FIG. 4A), the first amplifier input signal (e.g., signal 434 or 534B) may be based upon, at least in part, the second input signal (e.g., input signal 428 or 528B) and the second amplifier input signal (e.g., signal 444 or 544B) may be based upon, at least in part, the first input signal (e.g., input signal 426 or 526B). Further, in a second mode (814) (e.g., EVAL mode as shown on the right side of FIG. 5B) associated with the first amplifier portion (e.g., amplifier portion 432 of FIG. 4A), the first amplifier input signal (e.g., signal 434 or 534B) may be based upon, at least in part, the first input signal (e.g., input signal 408 or 508B), and the second amplifier input signal (e.g., input signal 444 or 544B) may be based upon, at least in part, the second input signal (e.g., input signal 410 or 510B).

In one or more embodiments, the first input signal (e.g., INP, also shown as signal 408 or 426) may correspond (824) to a first average voltage value associated with the first clock signal (e.g., clock signal 402). The first clock signal may be a true clock signal. Further, the second input signal (e.g., INN, also shown as signal 410 or 428) may correspond (826) to a second average voltage value associated with the second clock signal (e.g., clock signal 404). The second clock signal may be a complementary clock signal.

Further, in one or more embodiments, the method 800 may include receiving (802), by a low pass filter (e.g., filter 406) in communication with the first amplifier portion (e.g., amplifier portion 432 of FIG. 4A), the first clock signal (e.g., clock signal 402) and the second clock signal (e.g., clock signal 404). The method 800 may further include outputting (804), by the low pass filter (e.g., filter 406) in communication with the first amplifier portion (e.g., amplifier portion 432 of FIG. 4A) the first input signal (e.g., input signal 408 or 508B) and the second input signal (e.g., input signal 410 or 510B). The method 800 may also include attenuating (816), by a high impedance current source (e.g., current source 646) in communication with the first amplifier (e.g., amplifier 450, 550B, or 650), first supply noise (e.g., supply noise 648) associated with the first output signal (e.g., signal 452, 552B, or 652). The method 800 may additionally include attenuating (818), by a bias current source (e.g., current source 656) in communication with the second amplifier portion (e.g., amplifier portion 460 of FIG. 4A), second supply noise (e.g., supply noise 654) associated with a second output signal (e.g., signal 662). Moreover, the method 800 may include reducing (820), by a unity feedback configuration of the first amplifier (e.g., amplifier 450, 550B, or 650), offset voltage associated with the first amplifier (e.g., amplifier 450, 550B, or 650). Furthermore, the method 800 may include reducing (822), by a controlled current source (e.g., current source 646 or 656) in communication with one of the first amplifier portion (e.g., amplifier portion 432 of FIG. 4A) and the second amplifier portion (e.g., amplifier portion 460 of FIG. 4A), power consumption of a circuit (e.g., circuit 400) comprising the first amplifier portion (e.g., amplifier portion 432 of FIG. 4A) and the second amplifier portion (e.g., amplifier portion 460 of FIG. 4A). Also, the method 800 may include reducing (828), by a differential amplifier structure of the first amplifier (e.g., amplifier 450, 550B, or 650), charge injection associated with the first amplifier (e.g., amplifier 450, 550B, or 650).

In another embodiment of the present disclosure, a system (e.g., duty cycle correction loop 100 or a larger component including the duty cycle correction loop 100) for duty cycle measurement and correction may include a duty cycle measurement circuit (e.g., circuit 400). The duty cycle measurement circuit (e.g., circuit 400) may include a first amplifier portion (e.g., amplifier portion 432 of FIG. 4A) configured to receive a first amplifier input signal (e.g., input signal 408 or 508B) and a second amplifier input signal (e.g., input signal 410 or 510B). The duty cycle measurement circuit (e.g., circuit 400) may further include a first amplifier (e.g., amplifier 450, 550B, or 650) of the first amplifier portion (e.g., amplifier portion 432 of FIG. 4A). The first amplifier (e.g., amplifier 450, 550B, or 650) may be configured to receive a first amplifier input signal (e.g., signal 434 or 534B) and a second amplifier input signal (e.g., signal 444 or 544B). In a first mode (e.g., AZ mode as shown on the left side of FIG. 5B) of the duty cycle measurement circuit (e.g., circuit 400), the first amplifier input signal (e.g., signal 434 or 534B) may be based upon, at least in part, the second input signal (e.g., input signal 428 or 528B) and the second amplifier input signal (e.g., signal 444 or 544B) may be based upon, at least in part, the first input signal (e.g., input signal 426 or 526B). Further, in a second mode (e.g., EVAL mode as shown on the right side of FIG. 5B) of the duty cycle measurement circuit (e.g., circuit 400), the first amplifier input signal (e.g., signal 434 or 534B) may be based upon, at least in part, the first input signal (e.g., input signal 408 or 508B), and the second amplifier input signal (e.g., input signal 444 or 544B) may be based upon, at least in part, the second input signal (e.g., input signal 410 or 510B).

The system (e.g., duty cycle correction loop 100 or a larger component including the duty cycle correction loop 100) may further include a duty cycle adjustment circuit (e.g., duty cycle adjust block 108) in communication with the duty cycle measurement circuit (e.g., circuit 400). The duty cycle adjustment circuit (e.g., duty cycle adjust block 108) may be configured to adjust a duty cycle corresponding to a clock based upon, at least in part, a measurement signal output by the a duty cycle measurement circuit (e.g., circuit 400).

Simulations of the architectures for duty cycle measurement described herein (e.g., as shown in FIG. 4A) may be performed and may show that the techniques and features described facilitate improvement of duty cycle measurement. For example, referring to FIGS. 9A and 9B, graphs 900A and 900B (respectively) illustrating example transfer characteristics associated with the architecture of FIG. 4A are shown. The graph 900A may show transfer characteristics for a duty cycle measurement block incorporating circuit 400, across all PVT, in the absence of supply noise, and the graph 900B may show transfer characteristics for a duty cycle measurement block incorporating circuit 400, across all PVT, in the presence of supply noise, where the X-axis indicates time, the Y1-axis indicates the duty cycle of INP and INN (%), and the Y2-axis indicates duty cycle measurement block output voltage (V). The graphs 900A and 900B show ideal duty cycle measurement block output switching points 902A and 902B (respectively). Further, the graphs 900A and 900B show INN signal duty cycle variation over time, as indicated by reference indicators 904A and 904B (respectively). The graphs 900A and 900B also show INP signal duty cycle variation over time, as indicated by reference indicators 906A and 906B (respectively).

Figure 9A:
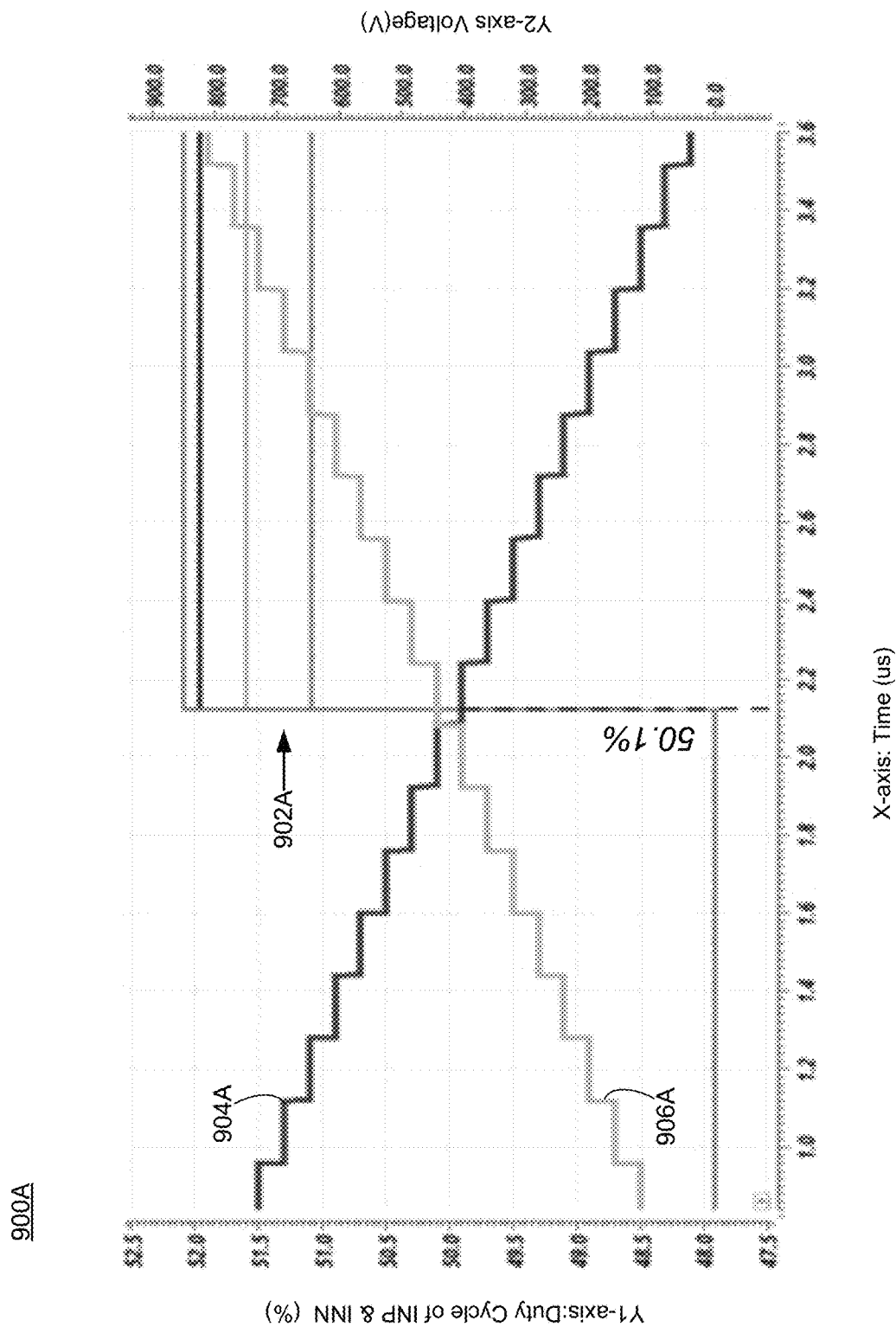
FIG. 9A is a graph illustrating example transfer characteristics associated with architectures for duty cycle measurement in accordance with the present disclosure.
Figure 9B:
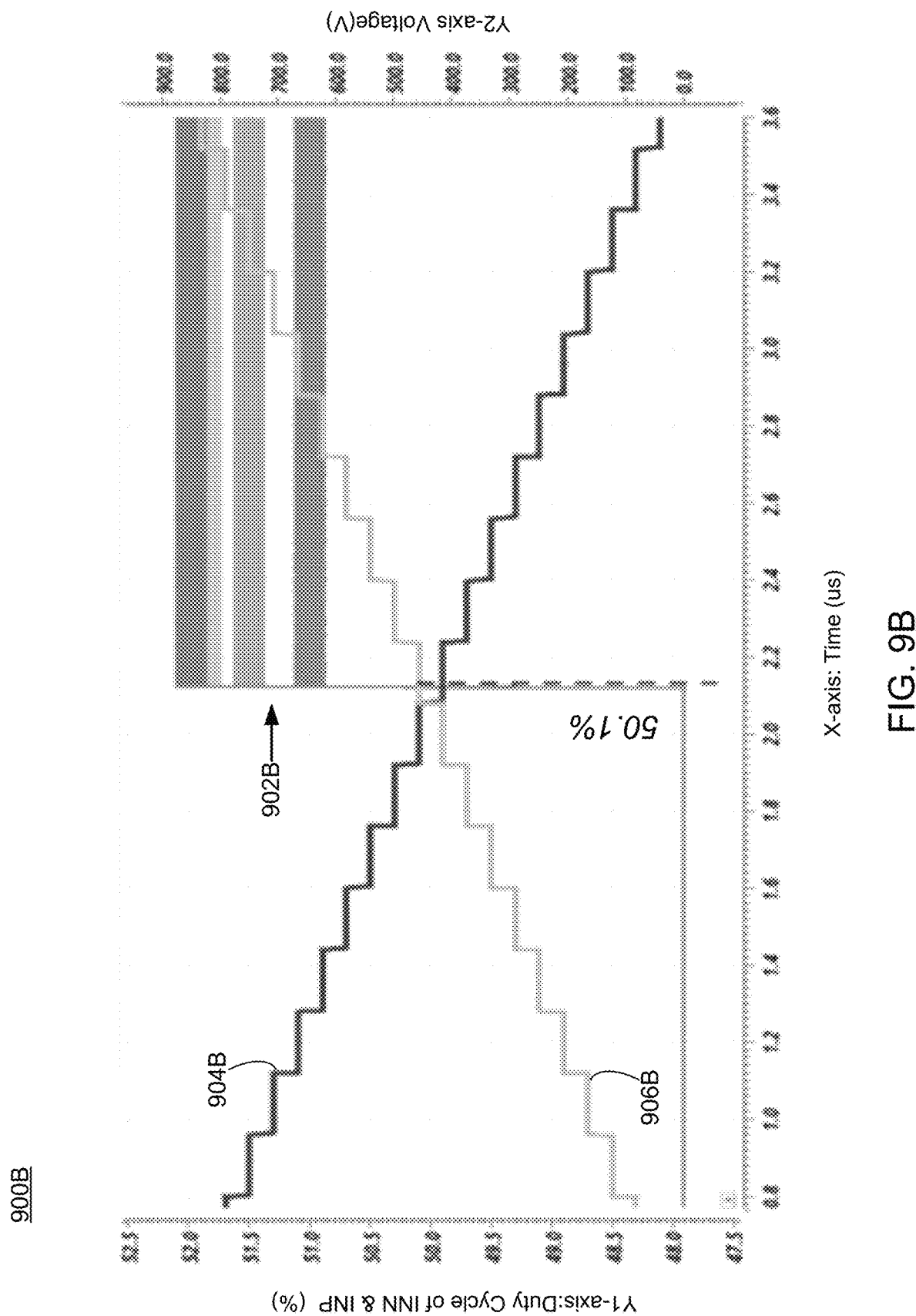
FIG. 9B is also a graph illustrating example transfer characteristics associated with architectures for duty cycle measurement in accordance with the present disclosure.

For graphs 900A and 900B, a duty cycle of INP/INN signals corresponding to a clock at 4266 MHz is swept over time (e.g., 48.5% to 52%, with a sweep resolution of 0.1%) and a switching point of the duty cycle measurement block output may be observed in the presence and absence of a 50 mVpp and 310 MHz supply noise. As shown in FIGS. 9A and 9B, the detection accuracy of the duty cycle measurement block (e.g., incorporating the architecture of FIG. 4A) may be improved significantly when compared against the architecture of FIG. 2 and the corresponding results shown in FIG. 3. As shown in FIGS. 9A and 9B, the architecture of FIG. 4A may detect duty cycle with an accuracy of about 0.1% at 4266 MHz when compared to about 1% detection accuracy for the architecture of FIG. 2 at the same clock frequency. Further, as can be observed in FIGS. 9A and 9B, little to no dithering is shown for the duty cycle measurement block's output, even in the presence of power supply noise.

Figure 10A:
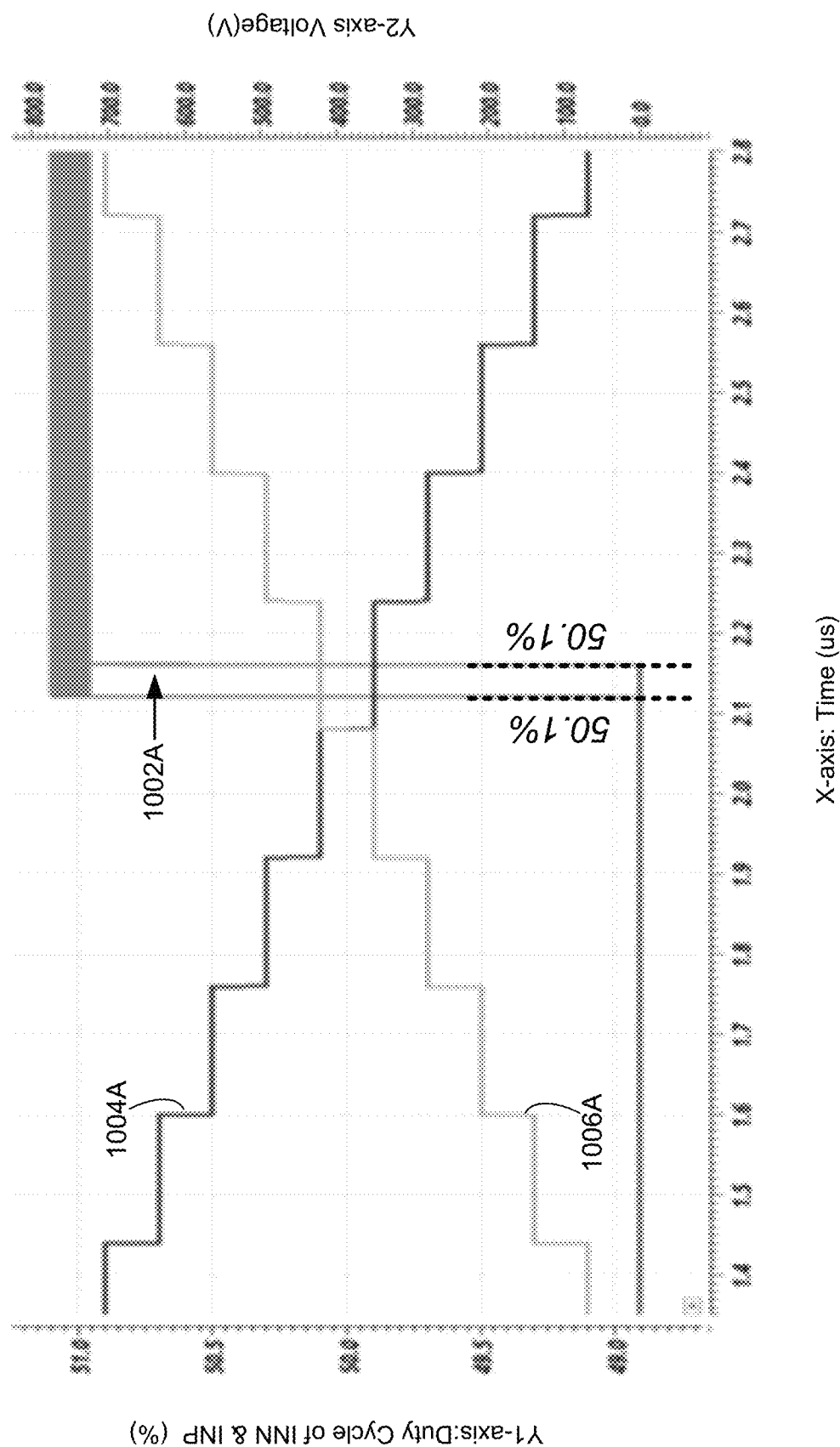
FIG. 10A is also a graph illustrating example transfer characteristics associated with architectures for duty cycle measurement in accordance with the present disclosure.
Figure 10B:
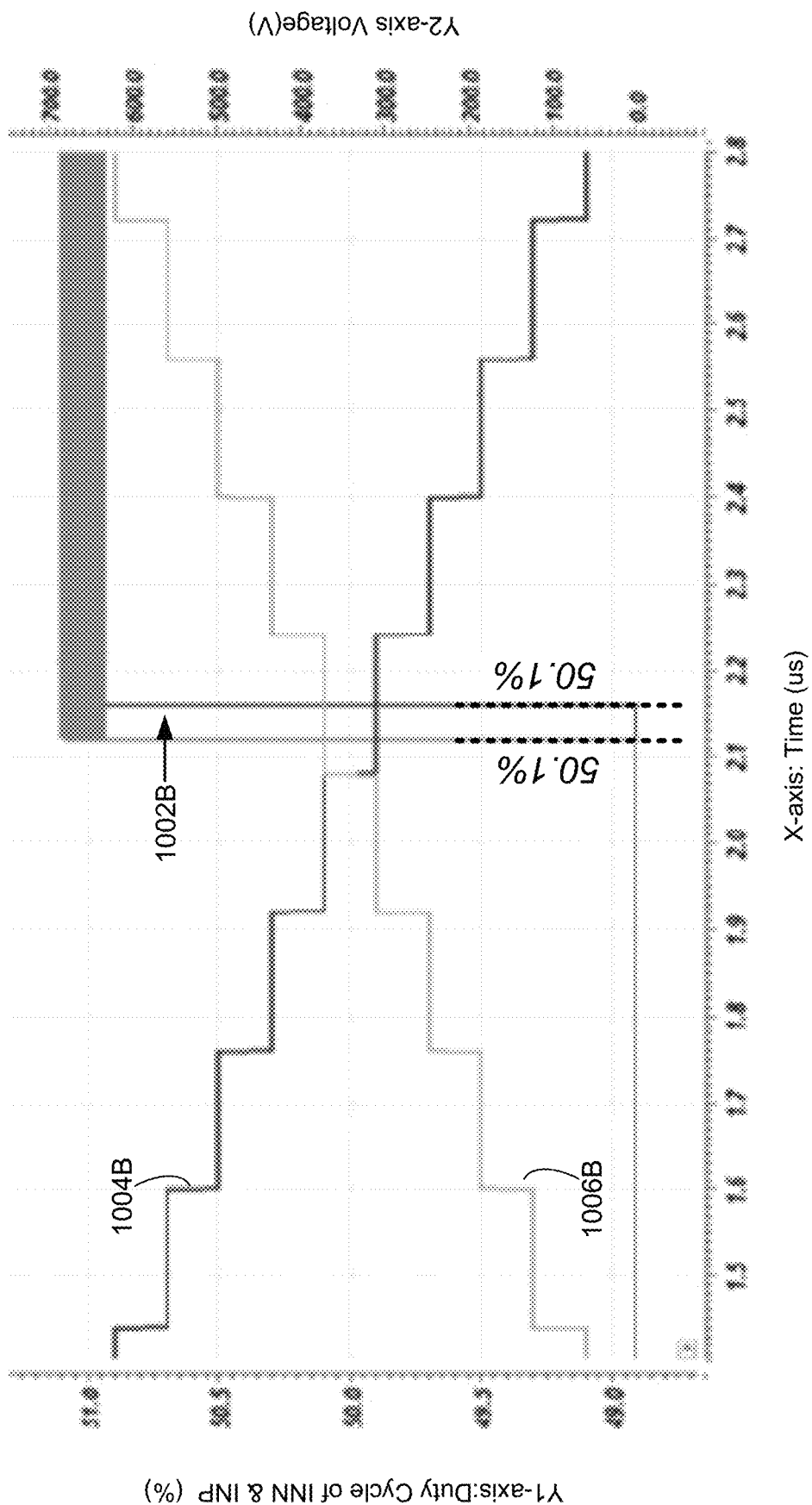
FIG. 10B is also a graph illustrating example transfer characteristics associated with architectures for duty cycle measurement in accordance with the present disclosure.

Further, device mismatch simulations may be performed to check the impact of comparator offset and differential charge cancellation (e.g., as described above regarding FIG. 7). Referring to FIGS. 10A and 10B, graphs 1000A and 1000B (respectively) illustrating example transfer characteristics associated with the architecture of FIG. 4A (incorporating one or more features described above regarding FIG. 7) are shown. The graph 1000A may show transfer characteristics for a duty cycle measurement block incorporating circuit 400, at TT/750 mV/25C (which may correspond to typical process/VDD voltage/temperature or TYP/Vnominal/Tnominal) with local mismatch and 200 samples, and the graph 900B may show transfer characteristics for a duty cycle measurement block incorporating circuit 400, at SS/660mV/-40C (which may correspond to slow process/VDD voltage/temperature or SLOW/Vlow/Tlow) with local mismatch and 200 samples, where the X-axis indicates time, the Y1-axis indicates the duty cycle of INP and INN (%), and the Y2-axis indicates duty cycle measurement block output voltage (V). The graphs 1000A and 1000B show ideal duty cycle measurement block output switching points 1002A and 1002B (respectively). Further, the graphs 1000A and 1000B show INN signal duty cycle variation over time, as indicated by reference indicators 1004A and 1004B (respectively). The graphs 1000A and 1000B also show INP signal duty cycle variation over time, as indicated by reference indicators 1006A and 1006B (respectively).

FIGS. 1000A and 1000B show results of a simulation with local mismatch at TT and SS corners (respectively) in the presence of supply noise. It can be observed from FIGS. 1000A and 1000B that the architecture of FIG. 4A (incorporating one or more features described above regarding FIG. 7) may provide a duty cycle measurement block detection accuracy of 0.1%, even in the presence of device mismatch. Additionally, the architecture of FIG. 4A incorporating one or more features described above regarding FIG. 6 (e.g., current controlled amplifiers in one of, or both of, the 1st and 2nd stages) may consume less switching power as one of, or both of, the amplifier stages may be current controlled. For example, about a 40% reduction in switching power consumed may be observed using the architecture of FIG. 4A (incorporating one or more features described above regarding FIG. 6), where max switching power at 4266 MHz may be about 350 uW for the architecture of FIG. 4A (incorporating one or more features described above regarding FIG. 6) and may be about 560 uW for the architecture of FIG. 2.

It will be apparent to those skilled in the art that various modifications and variations can be made to the embodiments of the present disclosure as described without departing from the spirit or scope of the invention. Thus, it is intended that embodiments of the present disclosure cover the modifications and variations of this invention provided they come within the scope of the appended claims and their equivalents.

What is claimed is:

1. A circuit for duty cycle measurement, the circuit comprising:
    a first amplifier portion configured to receive a first input signal corresponding to a first clock signal and a second input signal corresponding to a second clock signal;
    a first amplifier of the first amplifier portion, the first amplifier configured to receive a first amplifier input signal and a second amplifier input signal; and
    a second amplifier portion configured to receive a first output signal from the first amplifier portion;

wherein:
    in a first mode of the circuit, the first amplifier is in a closed loop configuration and the first amplifier input signal is based upon, at least in part, the second input signal and the second amplifier input signal is based upon, at least in part, the first input signal;
    in a second mode of the circuit, the first amplifier is in an open loop configuration and the first amplifier input signal is based upon, at least in part, a difference between the second input signal from the first input signal, and the second amplifier input signal is based upon, at least in part, a difference between the first input signal from the second input signal;
    in the second mode of the circuit, an effective input signal magnitude is based upon, at least in part, the difference between the first input signal from the second input signal increased by a factor of two; and
    to switch between the first mode of the circuit and the second mode of the circuit, a low frequency clock operating in a range of 10-25 MHz being used.

2. The circuit of claim 1, wherein the first input signal corresponds to a first average voltage value associated with the first clock signal and the first clock signal is a true clock signal, and the second input signal corresponds to a second average voltage value associated with the second clock signal and the second clock signal is a complementary clock signal.

3. The circuit of claim 1, further comprising:
a low pass filter in communication with the first amplifier portion, the low pass filter configured to receive the first clock signal and the second clock signal and output the first input signal and the second input signal.

4. The circuit of claim 1, wherein the first amplifier is in communication with a high impedance current source configured to attenuate supply noise associated with the first output signal.

5. The circuit of claim 1, wherein the second amplifier portion is in communication with a bias current source configured to attenuate supply noise associated with a second output signal.

6. The circuit of claim 1, wherein the first amplifier uses a unity feedback configuration that is configured to reduce offset voltage associated with the first amplifier.

7. The circuit of claim 1, wherein at least one of the first amplifier portion and the second amplifier portion is in communication with a controlled current source configured to reduce power consumption of the circuit.

8. The circuit of claim 1, wherein the first amplifier is a p-type differential amplifier.

9. The circuit of claim 1, wherein the second amplifier portion includes an n-type common source amplifier.

10. The circuit of claim 1, wherein the second amplifier portion is in communication with a p-channel metal-oxide-semiconductor (PMOS) current source.

11. The circuit of claim 1, wherein a differential amplifier structure of the first amplifier reduces a duty cycle detection error due to charge injection.

12. A method for duty cycle measurement, the method comprising:
    receiving, by a first amplifier portion, a first input signal corresponding to a first clock signal and a second input signal corresponding to a second clock signal;
    receiving, by a first amplifier of the first amplifier portion, a first amplifier input signal and a second amplifier input signal; and
    receiving, by a second amplifier portion, a first output signal from the first amplifier portion;

wherein:
    in a first mode of the circuit, the first amplifier is in a closed loop configuration and the first amplifier input signal is based upon, at least in part, the second input signal and the second amplifier input signal is based upon, at least in part, the first input signal;
    in a second mode of the circuit, the first amplifier is in an open loop configuration and the first amplifier input signal is based upon, at least in part, a difference between the second input signal from the first input signal, and the second amplifier input signal is based upon, at least in part, a difference between the first input signal from the second input signal;
    in the second mode of the circuit, an effective input signal magnitude is based upon, at least in part, the difference between the first input signal from the second input signal increased by a factor of two; and
    to switch between the first mode of the circuit and the second mode of the circuit, a low frequency clock operating in a range of 10-25 MHz being used.

13. The method of claim 1, wherein the first input signal corresponds to a first average voltage value associated with a true clock signal, and the second input signal corresponds to a second average voltage value associated with a complementary clock signal.

14. The method of claim 12, further comprising:
receiving, by a low pass filter in communication with the first amplifier portion, the first clock signal and the second clock signal; and
outputting, by the low pass filter in communication with the first amplifier portion, the first input signal and the second input signal.

15. The method of claim 12, further comprising at least one of:
    attenuating, by a high impedance current source in communication with the first amplifier, first supply noise associated with the first output signal;
    attenuating, by a bias current source in communication with the second amplifier portion, second supply noise associated with a second output signal;
    reducing, by a unity feedback configuration of the first amplifier, offset voltage associated with the first amplifier;
    reducing, by a controlled current source in communication with one of the first amplifier portion and the second amplifier portion, power consumption of a circuit comprising the first amplifier portion and the second amplifier portion; and
    reducing, by a differential amplifier structure of the first amplifier, charge injection associated with the first amplifier.

16. The method of claim 12, wherein the first amplifier is a p-type differential amplifier.

17. The method of claim 12, wherein the second amplifier portion includes an n-type common source amplifier.

18. The method of claim 12, wherein the second amplifier portion is in communication with a p-channel metal-oxide semiconductor (PMOS) current source.

19. A system for duty cycle measurement and correction, the system comprising:
    a duty cycle measurement circuit comprising:
        a first amplifier portion configured to receive a first input signal and a second input signal;
        a first amplifier of the first amplifier portion, the first amplifier configured to receive a first amplifier input signal and a second amplifier input signal, wherein:

in a first mode of the circuit, the first amplifier is in a closed loop configuration and the first amplifier input signal is based upon, at least in part, the second input signal and the second amplifier input signal is based upon, at least in part, the first input signal;

in a second mode of the circuit, the first amplifier is in an open loop configuration and the first amplifier input signal is based upon, at least in part, a difference between the second input signal from the first input signal, and the second amplifier input signal is based upon, at least in part, a difference between the first input signal from the second input signal;

in the second mode of the circuit, an effective input signal magnitude is based upon, at least in part, the difference between the first input signal from the second input signal increased by a factor of two; and to switch between the first mode of the circuit and the second mode of the circuit, a low frequency clock operating in a range of 10-25 MHZ being used; and a duty cycle adjustment circuit in communication with the duty cycle measurement circuit, the duty cycle adjustment circuit configured to adjust a duty cycle corresponding to a clock based upon, at least in part, a measurement signal output by the duty cycle measurement circuit.

20. The system of claim 19, wherein the first input signal corresponds to a first average voltage value associated with a true clock signal, and the second input signal corresponds to a second average voltage value associated with a complementary clock signal.

\* \* \* \* \*